United States Patent
Jeannin et al.

(10) Patent No.: US 12,094,377 B2
(45) Date of Patent: Sep. 17, 2024

(54) MULTIPLE RESOLUTION DISPLAY SCREEN AND PRODUCTION METHOD

(71) Applicant: ALEDIA, Echirolles (FR)

(72) Inventors: Olivier Jeannin, Grenoble (FR); Ivan-Christophe Robin, Grenoble (FR)

(73) Assignee: ALEDIA, Echirolles (FR)

( * ) Notice: Subject to any disclaimer, the term of this patent is extended or adjusted under 35 U.S.C. 154(b) by 0 days.

(21) Appl. No.: 17/802,305

(22) PCT Filed: Feb. 25, 2021

(86) PCT No.: PCT/EP2021/054659
§ 371 (c)(1),
(2) Date: Aug. 25, 2022

(87) PCT Pub. No.: WO2021/170708
PCT Pub. Date: Sep. 2, 2021

(65) Prior Publication Data
US 2023/0097333 A1    Mar. 30, 2023

(30) Foreign Application Priority Data

Feb. 26, 2020  (FR) ..................... 2001862

(51) Int. Cl.
*G09G 3/00* (2006.01)
*G06F 3/01* (2006.01)
*H01L 25/16* (2023.01)
*H01L 33/00* (2010.01)

(52) U.S. Cl.
CPC ............. *G09G 3/002* (2013.01); *G06F 3/013* (2013.01); *H01L 25/167* (2013.01); *H01L 33/0093* (2020.05); *G09G 2300/0439* (2013.01); *G09G 2340/0407* (2013.01); *G09G 2354/00* (2013.01)

(58) Field of Classification Search
CPC ........... G09G 3/002; G09G 2300/0439; G09G 2340/0407; G09G 2354/00; H01L 33/0093; H01L 25/167; G06F 3/013
See application file for complete search history.

(56) References Cited

U.S. PATENT DOCUMENTS 10,502,963 B1 * 12/2019 Noble ................ B29D 11/0073
10,503,007 B1 * 12/2019 Parsons ............. G02B 27/0172
11,158,690 B1 * 10/2021 Choi ................. G02B 27/0172

(Continued)

OTHER PUBLICATIONS

International Search Report issued in corresponding International Application No. PCT/EP2021/054659, mailed Apr. 9, 2021, pp. 1-2, European Patent Office, Rijswijk, Netherlands.

(Continued)

*Primary Examiner* — Sejoon Ahn
(74) *Attorney, Agent, or Firm* — HAUPTMAN HAM, LLP

(57) ABSTRACT

A display screen intended to display a multiple-resolution image and including a plurality of pixels distributed on a support, the screen including a first zone of a face of the support having a first density of pixels, enabling to display a first part of the image at a first resolution, and a second zone of the face of the support having a second density of pixels, strictly greater than said first density, enabling to display a second part of the image at a second resolution. The disclosure also relates to a display system including such a screen and a method for producing the screen.

18 Claims, 5 Drawing Sheets

(56) References Cited

U.S. PATENT DOCUMENTS

| | | | |
|---|---|---|---|
| 2012/0092397 A1* | 4/2012 | DeLuca | G09G 5/14 |
| | | | 345/698 |
| 2015/0177884 A1* | 6/2015 | Han | G06F 3/04166 |
| | | | 345/174 |
| 2017/0236466 A1 | 8/2017 | Spitzer et al. | |
| 2018/0269266 A1* | 9/2018 | Cancel Olmo | H10K 59/353 |
| 2018/0284451 A1 | 10/2018 | Eash et al. | |
| 2018/0373371 A1* | 12/2018 | Kim | G09G 3/3233 |
| 2018/0374433 A1* | 12/2018 | Xing | G09G 3/342 |
| 2018/0374738 A1* | 12/2018 | Lee | H01L 21/67288 |
| 2018/0375004 A1* | 12/2018 | Yamashita | H01L 24/48 |
| 2019/0179222 A1 | 6/2019 | Choy et al. | |
| 2019/0222733 A1* | 7/2019 | Nishide | H01L 27/14 |
| 2019/0237021 A1* | 8/2019 | Peng | G09G 5/003 |
| 2019/0377428 A1* | 12/2019 | Mirjalili | G02C 7/04 |
| 2019/0384136 A1* | 12/2019 | Grover | G09G 5/377 |
| 2019/0393198 A1 | 12/2019 | Takeya | |
| 2020/0160791 A1* | 5/2020 | Chung | G09G 3/3275 |
| 2020/0193900 A1* | 6/2020 | Chen | H05K 1/115 |
| 2020/0203450 A1* | 6/2020 | Lou | G02F 1/133 |
| 2021/0335327 A1* | 10/2021 | Li | G09G 5/363 |
| 2021/0358379 A1* | 11/2021 | Li | H10K 59/121 |

OTHER PUBLICATIONS

Written Opinion issued in corresponding International Application No. PCT/EP2021/054659, mailed Apr. 9, 2021, pp. 1-7, European Patent Office, Rijswijk, Netherlands.

* cited by examiner

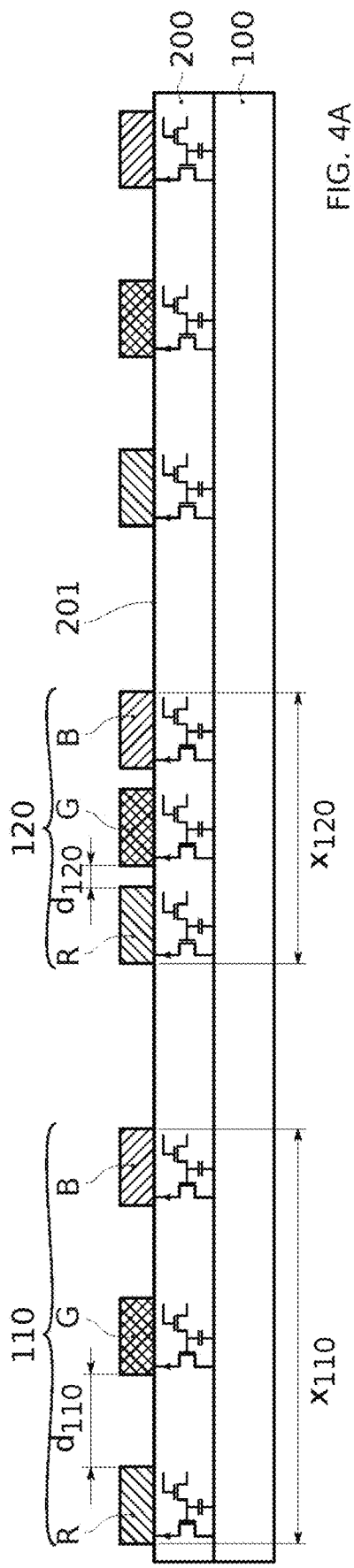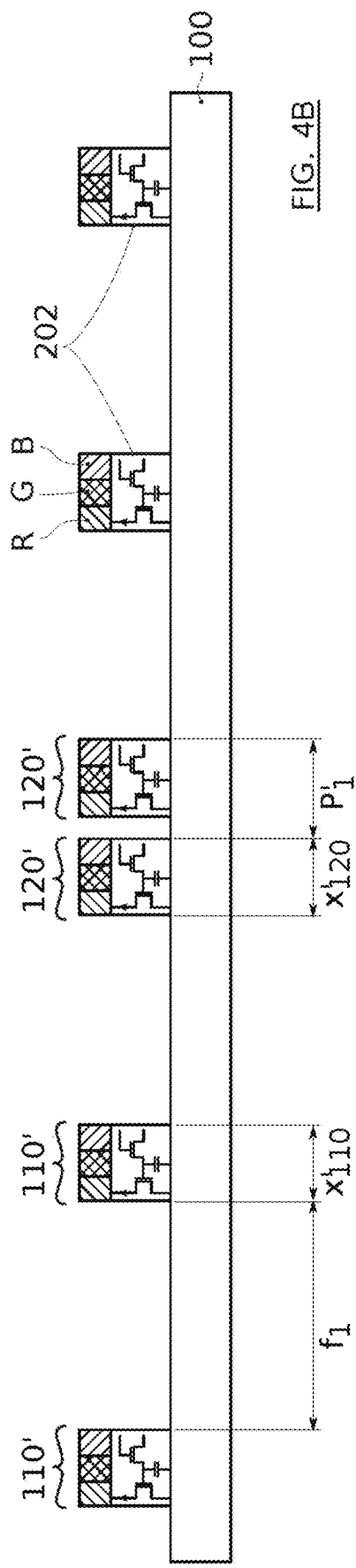

MULTIPLE RESOLUTION DISPLAY SCREEN AND PRODUCTION METHOD

The present application is a U.S. National Phase of International Application Number PCT/EP2021/054659, filed Feb. 25, 2021, which claims priority to French Application No. 2001862, filed Feb. 26, 2020.

TECHNICAL FIELD

The invention relates to the field of display screens. It finds a particularly advantageous application in the field of virtual reality or augmented reality headsets The invention can also be applied to virtual reality rooms.

STATE OF THE ART

Resolution, given as a density of pixels, is a key characteristic of display screens. It must be sufficiently high to prevent the human eye from perceiving a pixelization phenomenon under normal conditions of use of the screen.

The resolving power of the eye is of approximately one minute of arc, which corresponds to an angle α in the range of 0.017°, as shown in FIG. 1. Said resolving power is limited by the density of cone cells in the fovea, the most sensitive zone of the retina.

For an observer, objects contained within the angular sector of angle α in FIG. 1 are not distinctly seen. They cannot be resolved by the eye of the observer. The angle α therefore corresponds to the resolution limit of the eye.

A simple trigonometric ratio enables to determine the separation distance h between two objects necessary for a human eye located at an observation distance d to distinguish these two objects clearly.

Thus, in FIG. 1, two pixels a, b of the screen 1 separated by the distance h can be distinguished by the human eye located at the distance d of the screen 1, if $$h \geq 2d \cdot \tan\frac{\alpha}{2}.$$

On the contrary, if $$h < 2d \cdot \tan\frac{\alpha}{2},$$

the human eye will no longer clearly distinguish both pixels a, b.

To prevent the pixelization phenomenon, the separation distance h between two adjacent pixels must therefore be smaller than the distance 2d.

$$2d \cdot \tan\frac{\alpha}{2} \approx 3 \cdot 10^{-4} d.$$

This separation distance h between two adjacent pixels determines the resolution of the screen. Said resolution is generally expressed in pixels per inch (or ppi).

It appears that the resolution of the screen must be higher the closer the observer is to the screen. Three screen resolution estimations are presented below, for three observation distances corresponding to observation conditions described as distant, intermediary, and close.

Under distant observation conditions, for d≈3 metres for instance, a screen resolution of 25 ppi is sufficient to avoid the pixelization phenomenon. This corresponds to a separation distance between pixels in the range of 1 mm. Such a screen resolution is easily achievable and inexpensive. Such a screen is perfectly suited to applications as television screens or digital signage displays.

Under intermediary observation conditions, for d≈40 centimetres for instance, a screen resolution of 210 ppi is required to avoid the pixelization phenomenon. In this case, the distance separating two pixels is in the range of 120 µm. Such a screen resolution is achievable at a cost that is compatible with the manufacturing of mass-market applications, using for example pixel control circuits based on technologies involving thin film transistors (TFT). The display screen applications described here relate, for example, to computer screens and telephone screens.

Under close observation conditions, for d≈4 centimetres for instance, a screen resolution greater than or equal to 2000 ppi is required to avoid the pixelization phenomenon. In this case, the distance separating two pixels is in the range of 12 µm. Such a screen resolution is difficult to achieve with TFT-based technologies. Such a screen resolution is achievable by using, for example, pixel control circuits based on technologies relying on CMOS transistors. The manufacturing cost is however too high for mass-market applications, such as virtual reality or augmented reality headsets.

Another issue relating to these screens featuring a resolution greater than or equal to 2000 ppi concerns the quantity of digital data transmitted for display purposes.

Typically, for a virtual reality headset comprising two screens—one for each eye of the user—each screen has a characteristic dimension, for instance a diagonal length, in the range of 2 to 3 inches. The user thus enjoys a wide visual field, with an angle in the range of 100° to 120°. This improves the user's immersion into the virtual reality projected from the screens of the headset. Such a screen size, associated with such a resolution, involves a large quantity of pixels, typically greater than 12 megapixels (MPix).

For a virtual reality headset, the number of frames per second (fps) must be high, for example 120 fps, to improve the feeling of fluidity and comfort perceived by the user.

For a classic 10-bit encoding per subpixel and 3 subpixels per pixel (typically a red, green, and blue subpixel), the quantity of data to transmit per second to such a screen is significant, and typically greater than 40 Gbits/s.

Such a flow of digital data requires important resources, which are incompatible with mass-market applications. Furthermore, the data transmission capabilities of the optic nerve are limited, and not all the data displayed by such a screen can be processed by the human eye.

In practice, the retina of the human eye is made of different retinal zones, as shown in FIG. 2. Only the most sensitive zone of the retina, the fovea 1, features the maximum resolving power of the human eye. The resolving power of the fovea 1 can be 10 times greater than that of the surrounding zones 2, 3 of the retina 4.

The fovea 1 features a surface area of approximately 0.5 mm in diameter and a visual field of approximately 1.5°, whereas the retina 4 features a total surface area of 5.5 mm in diameter at the back of the eye, and a visual field of approximately 100°.

A known solution to limit the quantity of data to transmit consists in projecting onto the retina an image with multiple resolutions suited to the different retinal zones. The fovea will thus see a high-resolution part of the image (>2000 ppi), whereas the surrounding retinal zones will see complementary parts of the image featuring a lower resolution.

One solution consists in downgrading the image resolution of a high-definition screen that lies outside of the visual field of the fovea, through a system that monitors eye movements. The quantity of displayed data is thus reduced. However, the manufacturing of such a high-resolution screen remains expensive and complex. Furthermore, the visual field of the user is reduced when the user looks at the sides of the screen.

Document US 2018/284451 A1 discloses, for example, a peripherally downgraded display, intended to reduce the resolution around the foveal zone. This image processing is carried out a posteriori, by means of dedicated software for example. The quantity of data, however, remains unchanged. Additional processing is applied on the display, which requires an additional hardware or software layer.

Another solution disclosed in document EP3330772 A1 consists in forming, for each eye of the user, a composite image from a context image and a focus image that overlaps the context image. The context image is projected by a first low-resolution source screen, and the focus image is projected by a second high-resolution source screen.

The high-resolution screen is, in this case, of reduced dimensions. However, this solution remains complex. It requires great accuracy when overlapping the projected images. Furthermore, it is expensive. Indeed, it requires several source screens from which the composite image is formed. Furthermore, the visual field of the user is reduced when the user looks at the sides of the context image.

Document US 2017/236466 A1 discloses a solution that enables to reduce the quantity of data of the image formed on the display screen. According to this solution, a single datum is assigned to a group of several pixels of a low-resolution zone displayed on the screen. This solution requires an additional hardware layer, typically a dedicated controller, to perform the logic processing of the data assigned to the pixels.

The present invention aims at overcoming, at least partially, some of the abovementioned disadvantages.

In particular, an object of the present invention is to propose a multiple-resolution display screen to limit the complexity and/or cost of manufacturing.

Another object of the present invention is to propose a method for producing such a display screen.

Another object of the present invention is to propose a display system that improves the visual field of the observer.

The other objects, characteristics, and advantages of the present invention will be made clearer upon reading the following description in reference to the appended figures. It is understood that other advantages can be integrated.

SUMMARY

To achieve the abovementioned objectives, the present invention relates, according to a first aspect, to a display screen intended to display a multiple-resolution image and comprising a plurality of pixels distributed on a support.

Advantageously, the screen comprises a first zone of a face of the support having a first density of pixels, enabling to display a first part of the image at a first resolution, and a second zone of the face of the support having a second density of pixels, strictly greater than said first density, enabling to display a second part of the image at a second resolution.

Thus, this screen enables to display an image comprising at least a first part of the image having the first "low" resolution and at least a second part of the image having a second "high" resolution. Advantageously, the density of pixels necessary to form the high-resolution part of the image is located only on the second zone. The total pixel density is thus reduced with respect to that of known high-definition screens. The solution proposed by the present invention combines in a single screen at least two display zones with different resolutions, unlike the solution disclosed by document EP3330772 A1, which relies on two source screens that cooperate to display a composite image by overlapping the source images.

The complexity and the cost of such a screen are therefore reduced with respect to existing solutions.

The solution retained by the present invention is based on a material construction of differentiated zones of pixels within a same screen. Thus, the screen natively comprises pixels distributed according to different densities.

Contrary to solutions of the prior art, this differentiation between the first and second densities of pixels is not obtained by a posteriori processing enabling to locally and artificially reduce the pixel density of a screen comprising a homogeneous pixel density. Thus, groupings of pixel data as disclosed in document US 2017/236466 A1, or software or optical processes enabling to deform the displayed image with low-resolution zones and high-resolutions zones as disclosed in document US 2018/284451 A1, are based on principles that are completely opposed and contrary to that of the present invention.

This screen can advantageously be implemented in a virtual reality headset with a system that monitors eye movements, so that the fovea perceives the high-resolution part of the image, and the less sensitive zones of the retina perceive the surrounding low-resolution part of the image.

This screen can also be implemented in a virtual reality room. Such a room is configured to enable direct and headset-free viewing of the image displayed by the screen(s). A system that monitors eye movements, adapted to such a virtual reality room environment, can also be used in cooperation with the screen(s) according to the first aspect of the invention.

The dimensions and/or resolutions of the first and second zones of the screen are preferably adapted to the intended application. For example, for an application of such a screen in a virtual reality headset, the total surface area of the screen can be smaller than 25 $cm^2$. In that case, the second zone can feature a surface area smaller than or equal to 1 $mm^2$, and a resolution greater than 2000 ppi. For an application of such a screen in a virtual reality room, the total surface area of the screen can be greater than 1500 $cm^2$. In that case, the second zone can feature a surface area of a few $cm^2$ to several tens of $cm^2$, and a resolution greater than 250 ppi.

According to a second aspect, the invention relates to a display system comprising a display screen according to the first aspect, an optical projection system configured to project the image displayed by the screen onto the eye of an observer, and a system monitoring the eye movements of the observer configured to condition the projection of the image to said movements, so as to project the second part of the image displayed by the second zone on the fovea of the eye of the observer.

This display system advantageously enables to project a multiple-definition image wherein the high-resolution and low-resolution parts are fixed relative to one another. This display system can advantageously be implemented in a virtual reality headset.

In existing solutions, the high-resolution part of the image moves relative to the low-resolution part, which is fixed. In an extreme angular position of observation, at the limit of the observer's eye movement range, the high-resolution part borders the low-resolution part. Although the fovea still perceives the high-resolution part of the image, a part of the retina no longer perceives the surrounding context image. The observer's visual field is therefore reduced when they observe from these extreme angular positions, at the limit of their range of eye movement.

However, according to the invention, the projection of the entire image moves, so that the observer still perceives, in the same proportions, the same low-resolution and high-resolution parts of the multiple-resolution image, regardless of the angular position of their eyes. The fovea and the retina continue to perceive the same image size. This prevents the visual field of the observer from being truncated. For virtual or augmented reality applications, this improves the immersive experience of the observer.

The invention also relates, according to a third aspect, to a method for producing a display screen intended to display a multiple-resolution image and comprising a first zone having a first density of pixels enabling to display a first part of the image at a first resolution, and a second zone having a second density of pixels, strictly greater than said first density, enabling to display a second part of the image at a second resolution. This method in particular comprises the following steps:

Providing a support able to receive a plurality of pixels,
Providing at least one donor substrate comprising pixels at a base density comprised in the range between the first density of pixels and the second density of pixels,
Performing, with a first buffer, a first transfer onto the support, for example by means of mass transfer technology, of a first set of pixels having the first density from the at least one donor substrate, so as to form the pixels of the first zone,
Performing, with a second buffer of dimensions smaller than that of the first buffer, at least one second transfer onto the support, for example by means of mass transfer technology, of at least a second set of pixels from the at least one donor substrate, so as to form the pixels of the second zone of the screen featuring the second density of pixels.

This method enables to form on the same support two zones with different pixel densities. The first buffer is configured to form at least the pixels on the first zone, by pixel transfer from the donor substrate. According to one possibility, said first transfer enables to also transfer the pixels intended to be part of the second zone. The first transfer of pixels is thereby optimised.

The second transfer of pixels is intended to form the pixels of the second zone. It can be performed on a part of the support that does not have any pixels, through a second buffer configured to transfer a set of pixels having directly the second pixel density. Alternatively, it can be performed on a part of the support already comprising the pixels transferred during the first transfer, through a second buffer configured to transfer a set of pixels having a complementary pixel density. The pixels of this set of pixels are then transferred among the pixels already present, so as to increase the density of pixels to achieve the second pixel density and thereby form the second zone of the screen. This second transfer can be repeated several times until the second pixel density is reached. The second buffer can be configured to transfer one or several sets of pixels having the first pixel density. It can be structurally identical to the first buffer, with a transfer zone having smaller dimensions than that of the first buffer. Such a method comprising at least two successive transfers from the at least one donor substrate enables to produce a multiple-resolution screen by limiting the number of steps and the complexity of the method.

The mass transfer technology further allows to reduce the production costs of such a screen.

BRIEF DESCRIPTION OF THE FIGURES

The purposes, objects, characteristics, and advantages of the invention will be made clearer upon reading the detailed description of its embodiments, which are illustrated by the following accompanying figures, wherein:

FIG. 4A schematically shows a cross-section of the pixels of a display screen according to one embodiment of the present invention.

FIG. 4B schematically shows a cross-section of the pixels of a display screen according to another embodiment of the present invention.

Figure 1:
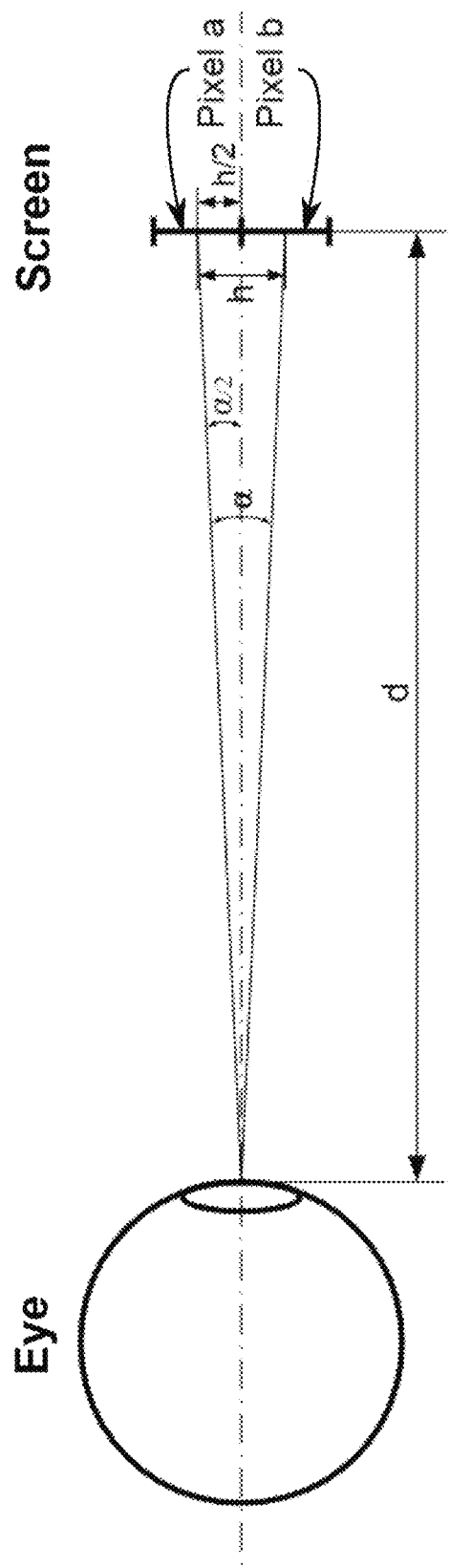
FIG. 1 schematically shows the resolving power of the human eye.

These figures are provided by way of non-limiting examples of the invention. They are schematic representations of the principle intended to facilitate understanding of the invention and are not necessarily at the scale of practical applications. In particular, the dimensions of the pixels and the of the different parts of the screen and of the display system are not true to scale. Moreover, the path of light beams within the display system is not necessarily true to reality.

DETAILED DESCRIPTION

Before conducting an in-depth review of the embodiments of the invention, it should be noted that the invention according to its first aspect comprises in particular the following optional characteristics that can be used in association or alternatively.

According to one example, the second pixel density is at least five times, preferably ten times greater than the first pixel density.

According to one example, the first pixel density ranges from 200 pixels per inch (ppi) to 3000 ppi. This sizing is in particular adapted to small screens that are integrated in virtual reality headsets. According to another example, the first pixel density ranges from 50 ppi to 250 ppi. This sizing is in particular adapted to large screens that are integrated in virtual reality rooms.

According to one example, the second pixel density ranges from 3000 ppi to 15000 ppi. This sizing is in particular adapted to small screens that are integrated in virtual reality headsets. According to another example, the second pixel density ranges from 250 ppi to 2000 ppi. This sizing is in particular adapted to large screens that are integrated in virtual reality rooms.

According to one example, the second zone has a surface area smaller than 4 mm², preferably smaller than or equal to 1 mm². This sizing is in particular adapted to small screens that are integrated in virtual reality headsets. According to another example, the second zone has a surface area smaller than 100 mm², preferably smaller than or equal to 10 mm². This sizing is in particular adapted to large screens that are integrated in virtual reality rooms. This enables to reduce the cost of the screen and to limit the total quantity of digital data to transmit for display purposes, without downgrading the perception by the fovea of the high-resolution part.

According to one example, the second zone is surrounded by the first zone.

According to one example, the second zone is located at the centre of the first zone.

According to one example, at least the pixels of the second zone are smart pixels, each comprising dedicated control electronics, said smart pixels each having a width smaller than or equal to 50 μm, preferably smaller than or equal to 25 μm. The control electronics of such smart pixels are typically integrated directly under the LEDs or μLEDs forming the subpixels of these smart pixels. The second zone is preferably only produced from such smart pixels. In this case, the second zone does not use control electronics based on TFT-type technologies. This enables to increase the second pixel density so as to achieve high resolutions, typically greater than 2000 ppi.

According to one example, the display screen comprises at least another zone separating at least partially the first and second zones, the said at least one other zone having a density of pixels comprised between the first density of pixels and the second density of pixels, the said at least one other zone enabling to display at least one other part of the image with an intermediate resolution comprised between the first and second resolutions. This enables to generate a progressive transition between the first and second zones. This possibly enables to match the sensitivity profile of the retina shown in FIG. 2.

According to one example, the first and second pixel densities and the density of pixels of the at least one other zone are selected so as to display a multiple-resolution image having a variation of resolution between the first and second parts of the image and the at least one other part of the image that is similar to a sensitivity profile of a retina of a human eye. This enables to improve the perception of the user.

According to one example, the first and second pixel densities and the density of pixels of the at least one other zone are selected so as to display a multiple-resolution image having a linear variation of resolution between the first and second parts of the image and the at least one other part of the image. This enables to simplify the design of the display screen.

According to one example, the display screen has, in a principal plane, a characteristic dimension, for example a diagonal length, ranging from 2 inches to 10 inches. This sizing is in particular adapted to small screens that are integrated in virtual reality headsets. According to another example, the display screen has, in a principal plane, a characteristic dimension, for example a diagonal length, ranging from 20 inches to 70 inches. This sizing is in particular adapted to large screens that are integrated in virtual reality rooms.

The invention according to a second aspect comprises in particular the following optional characteristics, which can be used in association or alternatively:

According to one example, the display system further comprises a body, and the system monitoring the observer's eye movements is configured to change the positions of the screen and/or the optical projection system relative to the body.

According to one example, the optical projection system comprises a curved mirror opposite the screen configured to reflect the image displayed by the screen, and a focusing lens opposite the observer configured to focus the reflected image on the retina of the eye.

According to one example, the screen is fixed relative to the body and the optical projection system is at least partially mobile relative to the body, the position of the optical projection system being modified by a movement of the focusing lens and/or the curved mirror relative to the body of the display system.

According to one example, the optical projection system comprises a system of lenses opposite the screen configured to transmit the image displayed by the screen, and a curved mirror opposite the observer configured to reflect said transmitted image towards the eye of the observer.

According to one example, the optical projection system is fixed relative to the body and the screen is at least partially mobile relative to the body, the position of the screen being modified by a movement of the screen in a principal plane of the screen, relative to the body of the display system.

According to one example, the optical projection system is configured to project the image displayed by the screen at a magnification rate greater than or equal to 1.

The invention according to a second aspect comprises in particular the following optional characteristics, which can be used in association or alternatively:

According to one example, the at least one donor substrate comprises a first donor substrate comprising pixels at the first density of pixels and a second donor substrate comprising pixels at the second density of pixels.

According to one example, the first transfer is performed from the first donor substrate and the at least one second transfer is performed once from the second donor substrate.

According to one example, the at least one donor substrate is a single donor substrate comprising pixels having only the first density of pixels.

According to one example, the first transfer is configured to form the pixels of the first zone and a part of the pixels of the second zone, and the second transfer is repeated several times to complete the pixels of the second zone, so as to achieve the second density of pixels in the second zone.

According to one example, the pixels are smart pixels, each comprising dedicated control electronics, said smart pixels each having a width smaller than or equal to 50 μm, preferably smaller than or equal to 25 μm.

Unless they are incompatible, it should be understood that the different aspects of the invention, the display screen, the display system, and the production method can comprise, mutatis mutandis, all or part of the characteristics listed below.

The invention can therefore also be implemented in virtual reality or augmented reality devices.

In the present invention, the display screen in a single continuous screen comprising at least two different pixel densities on the same continuous face configured to display, at a given moment, a single multiple-resolution image.

The term multiple-resolution image is used to describe an image having simultaneously at least one first part of image at a first resolution and at least one second part of image at a second resolution different from the first resolution.

A pixel of an image corresponds to the unitary element of the image displayed by a display screen. When forming a colour image, each colour pixel generally comprises at least three components emitting and/or converting a luminous flux, also called subpixels.

In what follows, these subpixels each emit a luminous flow substantially in a single colour (for example red, green, and blue). The colour of a pixel perceived by an observer stems from the overlapping of these different luminous fluxes emitted by the subpixels.

Although it may comprise several subpixels, a pixel forms a well-defined entity. The solution retained for the purpose of the present invention involves two different densities of this same entity.

It should be understood that the density of pixels cannot be compared or assimilated with the density of subpixels. The person skilled in the art is perfectly able to distinguish a pixel density, for example expressed in ppi, from a density of subpixels or of components of said pixels.

Typically, a LED or a µLED enables to emit the luminous flux associated with a subpixel. In the present application, the term "LED size" is its principal extension dimension along the plane of the support. The size of a subpixel is therefore directly correlated with the size of the LED.

In the present patent application, the terms "light-emitting diode", "LED", or simply "diode" are used as synonyms. The term "LED" can also be used to describe a "micro-LED".

The pixel density is an area density expressed in ppi (pixels per inch), according to the most common notation and unless otherwise mentioned. In the present patent application, the terms "concentration" and "density" are synonymous.

The term "matrix" is used to describe a table in the form of rows and columns. For example, a matrix can comprise a plurality of rows and a plurality of columns, or a single row and a plurality of columns, or a plurality of rows and a single column.

Unless explicitly mentioned, it should be understood that, for the purpose of the present invention, the relative arrangement of an element inserted between two other elements does not necessarily mean that the elements are directly in contact with one another.

The steps to produce the different elements are meant in a broad sense: they can be carried out as several sub-steps that are not necessarily successive.

The terms "substantially", "approximately", "in the range of", or "similar" mean, when they relate to a value, "within the 10% range" of that value, or, when they relate to angular orientation, "within 10°" of that orientation. Thus, a direction that is substantially perpendicular to a plane means a direction having an angle of 90±10° with respect to that plane.

Inverse engineering or construction analysis methods can determine whether a screen comprises the characteristics described in the present application. These techniques enable, in particular, to determine whether the display screen comprises a zone with a high density of pixels, as described in the present invention. An analysis of the distribution of pixels on the screen support can be conducted, for example, from optical microscopy measurements on a disassembled screen. These techniques also allow to determine which type of control electronics is associated with the pixels, and in particular whether the control electronics relies on transistors integrated directly under the LEDs/µLEDs forming the subpixels of a smart pixel.

In what follows, the invention is mainly described through examples relating to an application concerning virtual reality headsets. It should be understood that these examples can easily be adapted to other applications, in particular an application relating to virtual reality rooms. The person skilled in the art will thus be able to adapt, mutatis mutandis the dimensions provided in what follows to different intended applications, in particular in the case of virtual reality rooms.

A first embodiment of a display screen according to the invention will now be described with reference to FIG. 3A.

The display screen 10 typically comprises a continuous support 100 with a face 101 able to receive pixels 110, 120. This face 101 can be flat or curved. It can be opaque, semi-transparent, or transparent. It can be of rectangular shape as shown in FIG. 3A, or oval, or of any shape. The size of this display screen 10, i.e. at least one characteristic dimension of this screen measured as a projection on the plane of the page, preferably ranges from 2 inches to 10 inches, and preferably from 2 inches to 5 inches. For certain applications, for example in the field of augmented reality, the size of this display screen 10 can be of less than 2 inches, and even of less than 1 inch, and even less than ½ an inch. In the example shown in FIG. 3A, this characteristic dimension can be the diagonal length of the screen 10.

The face 101 comprises at least two zones 11, 12, whereon are respectively distributed the pixels 110, 120. The first zone 11 has a first pixel density 110, for example ranging from 200 ppi to 2000 ppi, and the second zone 12 has a second density of pixels 120, different from the first density of pixels 110, for example greater than or equal to 2000 ppi. The face 101 is preferably completely covered by these at least two zones 11, 12.

The first zone 11 is intended to display a low-resolution context image and the second zone 12 is intended to display a high-resolution image. The first zone 11 is thus located around the second zone 12. The first zone 11 surrounds the second zone 12 over a major part of the perimeter of the second zone 12, and preferably over the totality of the second zone 12.

The first zone 11 extends preferably from a closed circumference 121 of the second zone 12 to the edges 102 of the face 101. Its surface area preferably covers at least half the surface area of the screen. Its shape preferably matches the shape of the face 101, and the closed circumference 121 of the second zone 12.

The pixels 110 of the first zone 11 can be distributed in the form of a first matrix of pixels with a pitch p1 along a first direction x and a pitch p2 along a second direction y. The pitches p1 and p2 can range from 120 µm to 12 µm, so as to achieve a first density of pixels 110 on this first zone 11 ranging from 200 ppi to 2000 ppi. According to one possibility, the pitch p1 is equal to the pitch p2.

Figure 3A:
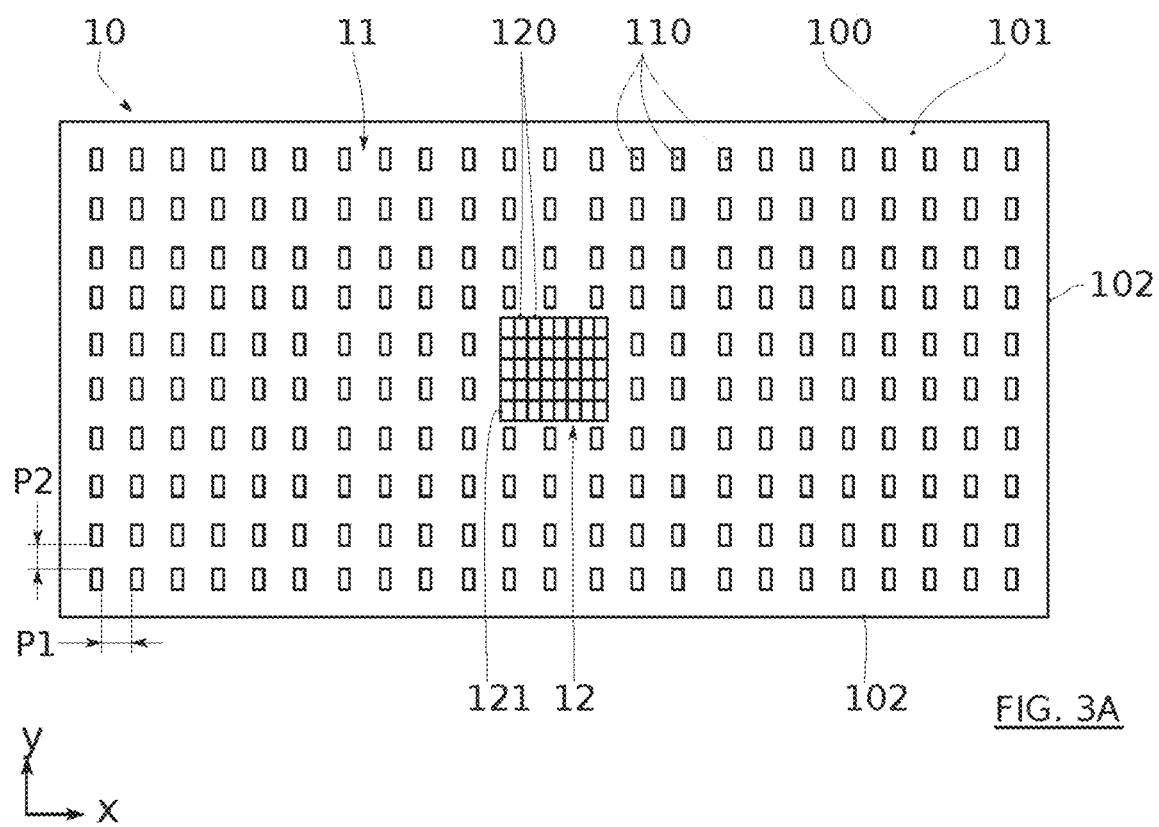
FIG. 3A schematically shows a distribution of the pixels of a display screen according to one embodiment of the present invention.

The second zone 12 can be substantially square, as shown in FIG. 3A, or round, or oval, or of any shape. It has a closed circumference 121 surrounded at least partially by the first zone 11. It is preferably separated from the edges 102 of the face 101, and preferably centred relative to the face 101, as shown in FIG. 3A. Its surface preferably covers less than half the surface area of the screen. It has, for example, a surface area smaller than 4 mm², preferably smaller than or equal to 1 mm².

The ratio between the surface areas of the first and second zones 11, 12 can be greater than 5, and preferably greater than 10.

The pixels 120 of the second zone 12 can be distributed in the form of a second matrix of pixels with a pitch p1' along the direction x and a pitch p2' along the direction y. The pitches p1' and p2' are preferably less than 12 μm, so as to achieve a second density of pixels 120 on this second zone 12 greater than 2000 ppi. According to one possibility, the pitch p1' is equal to the pitch p2'.

Other embodiments of the screen 10 according to the invention can be envisaged. Only specific characteristics of the first embodiment are described below, the other not described characteristics are deemed to be identical to that of the first embodiment.

Figure 3B:
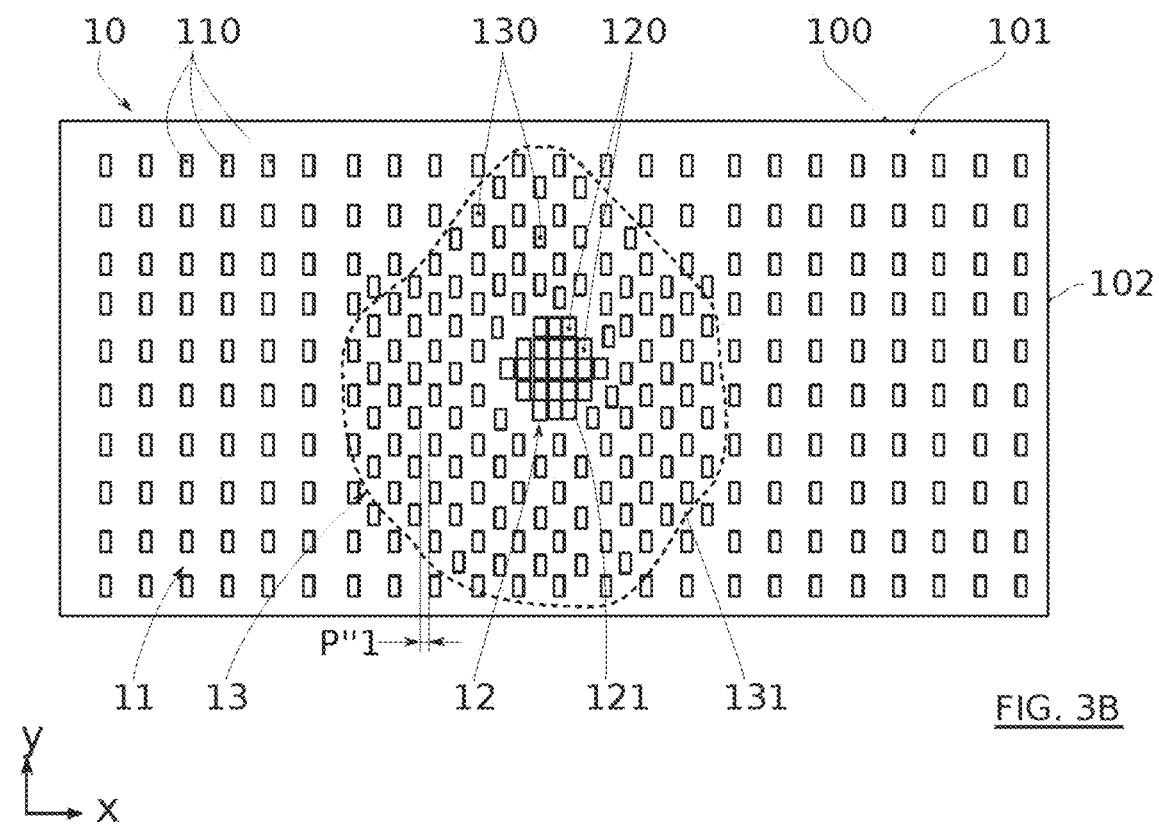
FIG. 3B schematically shows a distribution of the pixels of a display screen according to another embodiment of the present invention.

With reference to FIG. 3B, a second embodiment of a display screen according to the invention comprises a third zone 13 inserted between the first and second zones 11, 12 in the plane xy. This third zone 13 has a third pixel density 130, for example ranging from 1000 ppi to 2000 ppi. The third density of pixels 130 ranges from the first density of pixels 110 to the second density of pixels 120.

The third zone 13 is intended to display a part of image at an intermediate resolution between the low-resolution image part of the first zone 11 and the high-resolution image part of the second zone 12. The third zone 13 is thus located around the second zone 12. The first zone 11 is thus located around the third zone 13.

The third zone 13 extends preferably from a closed circumference 121 of the second zone 12. The first zone 11 extends preferably from a closed circumference 131 of the third zone 13.

The first, second, and third pixel densities 110, 120, 130 and/or the relative occupied surfaces of the first, second, and third zones 11, 12, 13 on the face 101 of the screen 10 can be adjusted to prevent the eye from perceiving a halo effect and/or a sudden change of resolution in the displayed image.

Figure 2:
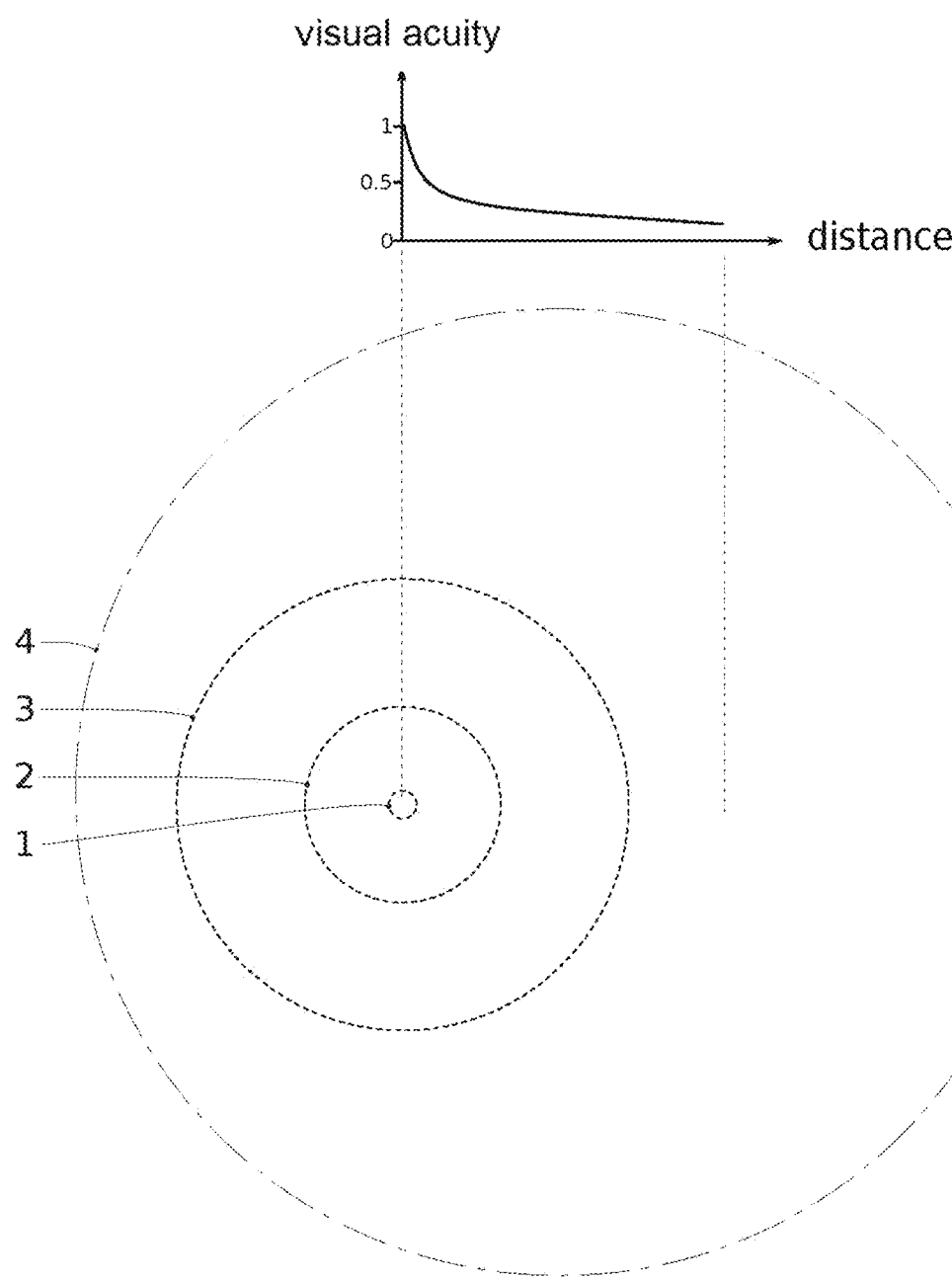
FIG. 2 schematically shows the different retinal zones of the human eye.

For example, the first, second, and third pixel densities 110, 120, 130 can be selected so as to match the visual acuity profile of the retina, as shown in FIG. 2. This enables to improve the perception of the image by the human eye. The relative occupied surfaces of the first, second, and third zones, 11, 12, 13 can also match the surfaces of the different retinal zones at the back of the eye. The surface area of the first zone 11 can be greater than the sum of the surface areas of the second and third zones 12, 13.

According to another example, the first, second, and third pixel densities 110, 120, 130 can be selected so as to achieve a density profile along a substantially linear axis of the plane xy. This limits the complexity of the screen.

The pixels 130 of the third zone 13 can be distributed in the form of a third matrix of pixels with a pitch p1" along the first direction x and a pitch p2" (not shown) along the second direction y. These pitches p1" and p2" can range from 120 μm to 12 μm, with, for example p1<p1"<p1' and/or p2<p2"<p2'.

These first and second embodiments are in no way limiting of the invention. Other zones having other pixel densities can be formed on the screen, so as to ensure, for example, a progressive transition from the second high-resolution zone towards the first low-resolution zone.

Generally, different density profiles and different zone distributions can be envisaged, so as to obtain, for example, a good compromise between the complexity and cost of manufacturing the screen, and the final perception by the user of the quality of the image displayed by that screen.

The pixels 110, 120, 130 can be formed by means of different technologies. They are preferably independently controlled by control electronics. The control electronics are commanded by at least one processor, preferably a single processor. Certain elements of the supply circuits and/or control circuits and/or command circuits, such as electrical connection lines, can be common to the pixels 110, 120.

With reference to FIG. 4A, the pixels 110, 120 can each be formed from three distinct subpixels R, G, B and separated by a pixel separation distance $d_{110}$, $d_{120}$.

These subpixels R, G, B are typically LED or μLED emitting respectively at wavelengths in the red, green, and blue range. These μLED can each be associated with control electronics based on thin film transistors (TFT). FIG. 4A shows such a screen architecture comprising a support 100, for example made of glass, a control layer 200 comprising the TFT-based control electronics, and the μLED R, G, B forming the pixels 110, 120 on the upper face 201 of the control layer 200.

The pixels 120 preferably have minimum subpixel separation distances $d_{120}$, typically in the range of a micrometre, so as to obtain a minimum pixel size $x_{120}$, typically in the range of 12 μm. Such pixels 120 enable to obtain a pixel density in the range of 2000 ppi.

The pixels 110 can be identical to the pixels 120. Alternatively, as the pixel density 110 required in the first zone 11 is smaller than the pixel density 120 required in the second zone 12, the pixels 110 can have a size $x_{110}$ greater than the size $x_{120}$ of the pixels 120, as shown in FIG. 4A. For example, the subpixel separation distances $d_{110}$ can be in the range of several tens of micrometres, so as to obtain a pixel size $x_{110}$ in the range of 60 μm.

With reference to FIG. 4B, another technology to produce pixels 110', 120', called smart pixels, can be implemented. Document US 2018/0247922 discloses such a smart pixel technology. This in particular enables to reduce the screen's manufacturing costs. This further enables to reduce the size of the pixels and to increase the pixel density.

According to this technology, smart pixels are manufactured independently from their final integration in the screen. The control electronics 202 of these smart pixels 110', 120' is first manufactured on a first associated substrate, by means of traditional microelectronics technologies (transistors made from a bulk substrate) that are less costly than TFT-based technologies. The subpixels R, G, B are also manufactured independently on a second associated substrate The subpixels R, G, B, are then associated with the control electronics 202. The smart pixels 110', 120' thus formed are then transferred onto the substrate 100, to form the first and second zones 11, 12.

The bulk transistors-based control electronics 202 of the smart pixels 110', 120' are significantly less expensive than TFT-based control electronics. Furthermore, the bulk transistors-based control electronics 202 of the smart pixels 110', 120' are significantly less cumbersome than TFT-based control electronics.

The independent and preliminary formation of subpixels R, G, B, from the second associated substrate thus enables to considerably reduce the sizes of these subpixels (in the case of smart pixels) with respect to the direct formation of the subpixels R, G, B on a control layer 200, as shown in FIG. 4A (case of TFT-controlled pixels). The sizes $x'_{110}$, $x'_{120}$ of the smart pixels 110', 120' thus formed are therefore considerably reduced (FIG. 4B).

These smart pixels 110', 120' each comprise pre-integrated control electronics 202 typically having pixel sizes $x'_{110}$, $x'_{120}$ smaller than or equal to 25 μm, for example in the 5.5 μm range.

Such smart pixels 110', 120' enable to obtain, after transfer onto the substrate 100, a pixel density greater than or equal to 4000 ppi.

Such a screen resolution greater or equal to 4000 ppi can advantageously be implemented in the second zone 12 configured to display the high-resolution (HR) part of image intended to be projected onto the fovea of the observer's eye. The cones in the fovea, i.e. the sensitive cells, can indeed have an elementary viewing angle twice as small as that of the other cells in the retina. Thus, a HR image at a resolution greater than or equal to 4000 ppi projected onto the fovea enables to avoid or limit the pixelization phenomenon perceived by the observer.

The pixel density depends not only on the size of each pixel, but also on the pitch $p_1$, $p'_1$ and/or $p_2$, $p'_2$ between each of these pixels (FIG. 4B).

The pixel transfer processes advantageously enable to adjust the pitch $p_1$ and/or $p_2$, and the pitch $p'_1$ and/or $p'_2$ relating to the first and second zones 11, 12 respectively.

The present invention also relates to a method for producing a display screen as described in the preceding embodiment examples. The formation of the first and second zones 11, 12 is described in what follows.

This process uses in particular a first buffer configured to collect pixels, preferably smart pixels comprising integrated control electronics, formed on a donor substrate. The collected pixels are then transferred to the substrate 100. This substrate 100 can be functionalised and/or transparent and/or flexible, in particular. These collection and transfer steps can be conducted by mass-transfer technologies. This enables to reduce the cost.

The pixels collected by the first buffer have a primary density that can either be equal to the pixel density of the donor substrate, or smaller than the pixel density of the donor substrate. In the latter case, this primary density is determined by the configuration of the first buffer. The pixels transferred onto the substrate 100 after a first transfer have a density equal to the primary density. The primary density is preferably equal to the first density of pixels of the first zone 11. The first zone 11 is thus formed by a single first transfer. This enables to reduce the number of steps and the duration of the manufacturing process. This also enables to simplify the formation of the first zone 11.

Alternatively, if the primary density is smaller than the first intended density of pixels, one or several additional transfers can be performed through the first buffer, so as to increase the density of transferred pixels until it reaches the first pixel density. The pixels transferred after each additional transfer are distributed among the pixels from the preceding transfer or transfers. The first zone 11 can thus be formed in several steps. This enables to use one or several donor substrates having a pixel density smaller than the first intended pixel density.

This principle of multiple transfers from a single donor substrate can advantageously be implemented to form the second zone 12.

The first transfer can be used to transfer pixels intended to be part of the second zone. The first transfer of pixels is thereby optimised. The second zone 12 is thus partially formed from this first transfer.

At least a second transfer of pixels is preferably performed to complete the formation of the second zone 12. This second transfer can be performed with the first buffer, by reducing the collection zone of the first buffer. Alternatively, the second transfer can be performed with a second specific buffer. This second buffer can have a collection surface area smaller than that of the first buffer. It can also be configured to collect denser sets of pixels compared with the first buffer.

According to one possibility, the first and/or second transfers are performed from different donor substrates. These different donor substrates can, in particular, have different pixel densities, respectively. The second zone 12 can be formed directly in a single step from a donor substrate having the second density of pixels.

Generally speaking, the first and second zones 11, 12 can be formed by combining one or several transfers performed by one or several buffers from one or several donor substrates. Furthermore, one or several intermediate zones between the first and second zones 11, 12 having pixel densities comprised in the range between the first and the second pixel densities 110, 120, can also be formed according to this method.

The steps of the production method can therefore be adapted mutatis mutandis to these different possible combinations.

The present invention also relates to a display system comprising a display screen as described in the preceding embodiment examples.

Figure 5:
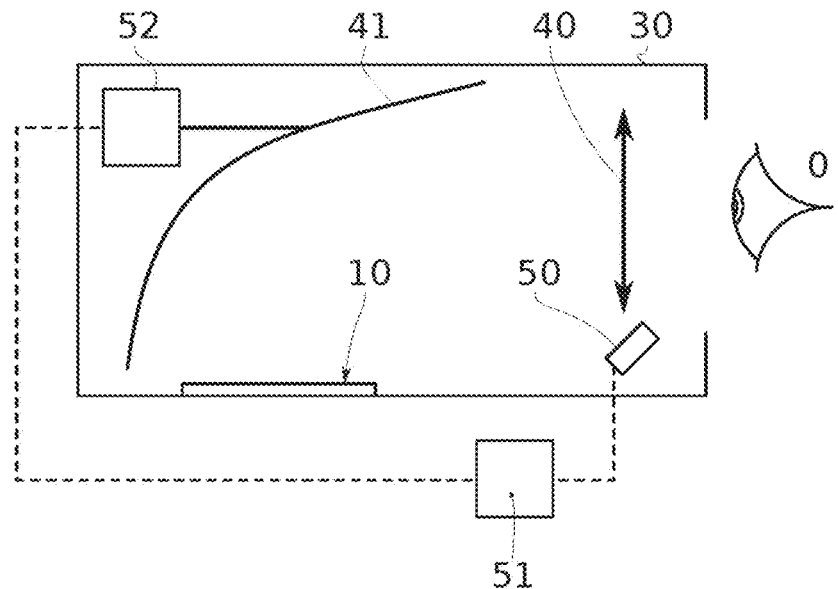
FIG. 5 schematically shows a display system according to one embodiment of the present invention.
Figure 6A:
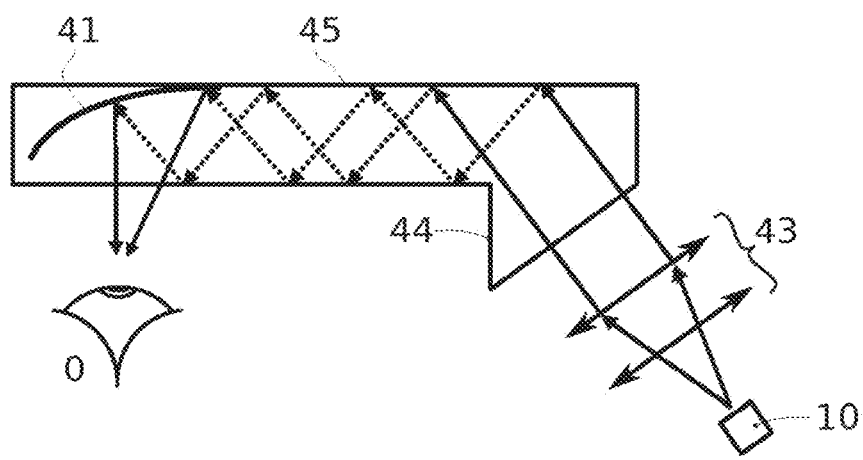
FIGS. 6A and 6B schematically show a display system according to another embodiment of the present invention.
Figure 6B:
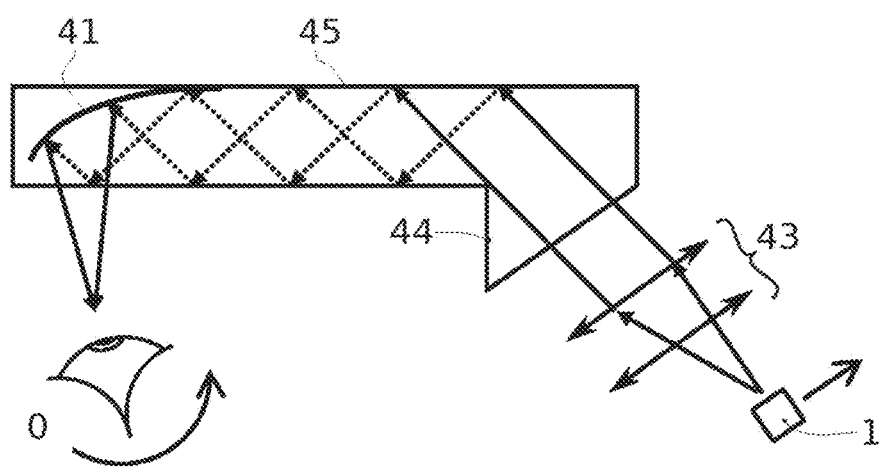

As shown in FIGS. 5, 6A and 6B, the system typically comprises a body 30, in the form of a headset for example, wherein is at least one display screen 10, one optical projection system, and a system to monitor the movements of the observer's eye O.

The optical projection system is configured to project the image displayed by the screen 10 onto the eye O. It can comprise a mirror 41, for example curved, configured to reflect the image displayed by the screen 10 onto the eye O. It can also comprise at least one lens 40, 43 configured to optically pair the screen 10 and the eye O.

This optical projection system is able to project the image displayed by the screen 10 at a magnification rate greater than or equal to 1. The curved mirror 41 enables for example to increase the apparent magnification of the image displayed by the screen 10. The immersive experience of the observer using the headset is thereby improved.

The system to monitor the observer's eye movements is configured to condition the projection of the image displayed by the screen 10 to said movements of the eye O. It is in particular configured to project the HR image part displayed by the second zone 12 of the screen 10 onto the fovea of the eye O of the observer.

This system to monitor the eye can typically comprise a camera 50 and a servo system 51, 52. The camera 50 is directed towards the eye and intended to record the movements of the eye O. The servo system is intended to control the movement of the mobile elements of the display system, i.e. the screen 10 and/or the mirror 41 and/or the lenses 40, 43 for example, so as to adapt in real time the projection of the image to the angular position of the eye O. The servo system 51, 52 can be of the servomotor type and comprises for example a travel motor 52 and an electronic control module 51 communicating with the camera 50 and the motor 52. The motor 52 is connected to the mobile elements so as to change the respective positions thereof.

The monitoring system can therefore change the positions of the screen 10 and/or the optical projection system 40, 41 relative to the body 30, based on the positions of the eye O measured by the camera 50.

In the example shown in FIG. 5, the screen 10 is fixed relative to the body 30 and the optical projection system 40, 41 is at least partially mobile relative to the body 30.

In this example, the optical projection system comprises typically a mirror 41 opposite the screen 10 and a focusing lens 40 opposite the eye O. The mirror 41 is preferably curved and enables to reflect a magnified image of the screen 10 towards the focusing lens 40. The focusing lens 40 then allows to focus this magnified image on the eye O of the observer.

The servo system 51, 52 is here configured to move the focusing lens 40 and/or the mirror 41 relative to the body 30 of the display system. The motion of the mirror 41 can be by translation along a curved trajectory and/or along a direction perpendicular to the focusing lens 40.

In the example shown in FIGS. 6A, 6B, the screen 10 is at least partially mobile relative to the body 30 and the optical projection system 41, 43 is fixed relative to the body 30.

In this example, the optical projection system 43 comprises typically one or several lenses opposite the screen 10, an optical guide 44, 45, and a mirror 41 opposite the eye O. The optical projection system 43 enables in particular to project the image displayed by the screen 10 along parallel beams (infinitely focused image). These beams then travel through the optical guide 44, 45 to the mirror 41 located at a terminal end of the optical guide. Optionally, diffractive components can enable to extract the beams at the terminal end of the optical guide. The proximal end of the optical guide can comprise a prism or a filter, for example with antireflective qualities, through which the light beams from the optical projection system 43 can enter. These beams can then be guided within the optical guide, for example by reflection onto the walls of the optical guide. This optical guide can be of the optical fibre type. The mirror 41 is preferably curved and enables to reflect light beams towards the eye O of the observer.

The servo system (not shown) is here configured to move the screen 10 relative to the body 30 of the display system. For a flat screen 10, this motion can be achieved by translation in the plane of the screen 10. For a curved screen 10 (formed for example from a flexible substrate such as mentioned above), this motion can be along a curved trajectory. The servo system can also enable to perform in-depth adjustments of the screen 10, by moving it along a direction perpendicular to the screen 10. FIG. 6A shows a first position of the eye O corresponding to a first position of the screen 10 configured to project the HR image part onto the fovea of the eye O. FIG. 6B shows a second position of the eye O and a corresponding motion of the screen 10 to a second position, so as to ensure that the HR image part is still projected onto the fovea of the eye O.

The invention is not limited to the embodiments described above and extends to all embodiments covered by the claims.

For example, the display system can comprise two display screens, each intended for one eye of the observer. This enables in particular to project a stereoscopic image.

The invention claimed is:

1. A display screen for displaying a multiple-resolution image and comprising a plurality of pixels distributed on a support, wherein the display comprises a first zone of a face of the support having a first density of pixels, enabling display of a first part of the image at a first resolution, and a second zone of the face of the support having a second density of pixels, strictly greater than said first density, enabling to display a second part of the image at a second resolution, and at least another zone separating at least partially the first and second zones, and having a density of pixels comprised between the first density of pixels and the second density of pixels, the said at least one other zone enabling to display at least one other part of the image with an intermediate resolution comprised between the first and second resolutions, wherein the first and second densities of pixels and the density of pixels of the at least one other zone are selected so as to display a multiple-resolution image having a variation of resolution between the first and second parts of the image and the at least one other part of the image that is similar to a sensitivity profile of a retina of a human eye.

2. The screen according to claim 1, wherein the second density of pixels is at least five times greater than the first density of pixels.

3. The screen according to claim 1 wherein the first density of pixels ranges from 50 pixels per inch (ppi) to 3000 ppi, and the second density of pixels ranges from 250 ppi to 15000 ppi.

4. The screen according to claim 1 wherein the second zone has a surface area smaller than 4 mm$^2$, preferably smaller than or equal to 1 mm$^2$.

5. The screen according to claim 1 wherein the second zone is surrounded by the first zone.

6. The screen according to claim 1 wherein the second zone is located at the centre of the first zone.

7. The screen according to claim 1 wherein at least the pixels of the second zone are smart pixels, each comprising dedicated control electronics, said smart pixels each having a width smaller than or equal to 50 μm.

8. The screen according to claim 1 wherein the first and second densities of pixels and the density of pixels of the at least one other zone are selected so as to display a multiple-resolution image having a linear variation of resolution between the first and second parts of the image and the at least one other part of the image.

9. The screen according to claim 1 having, in a principal extension plane, a characteristic dimension ranging from 2 inches to 10 inches.

10. A display system comprising a display screen for displaying a multiple-resolution image and comprising a plurality of pixels distributed on a support, wherein the display comprises a first zone of a face of the support having a first density of pixels, enabling display of a first part of the image at a first resolution, and a second zone of the face of the support having a second density of pixels, strictly greater than said first density, enabling to display a second part of the image at a second resolution, an optical projection system configured to project the image displayed by the screen onto the eye of an observer, and a system monitoring the eye movements of the observer configured to condition the projection of the image to said movements, so as to project the second part of the image displayed by the second zone on the fovea of the eye of the observer.

11. The display system according to claim 10 further comprising a body, and wherein the system monitoring the eye movements of the observer is configured to change the positions of the screen and/or the optical projection system relative to the body.

12. The display system according to claim 11 wherein the optical projection system comprises a curved mirror opposite the screen configured to reflect the image displayed by the screen, and a focusing lens opposite the observer configured to focus said reflected image onto the retina of the eye, and wherein the screen is fixed relative to the body and the optical projection system is at least partially mobile relative to the body, the position of the optical projection system being changed by a movement of the focusing lens and/or of the curved mirror relative to the body of the display system.

13. The display system according to claim 11 wherein the optical projection system comprises a system of lenses opposite the screen configured to transmit the image displayed by the screen, and a curved mirror opposite the observer configured to reflect said transmitted image towards the eye of the observer and wherein the optical projection system is fixed relative to the body and the screen is at least partially mobile relative to the body, the position of the screen being changed by a movement of the screen in a primary plane of the screen, relative to the body of the display system.

14. The display system according to claim 10 wherein the optical projection system is configured to project the image displayed by the screen at a magnification rate greater than or equal to 1.

15. A method for producing a display screen for displaying a multiple-resolution image and comprising a first zone having a first density of pixels enabling display of a first part of the image at a first resolution, and a second zone having a second density of pixels, strictly greater than said first density, enabling display of a second part of the image at a second resolution, said method comprising the following steps:
providing a support able to receive a plurality of pixels,
providing at least one donor substrate comprising pixels at a base density comprised in the range between the first density of pixels and the second density of pixels,
performing, with a first buffer, a first transfer onto the support of a first set of pixels having the first density from the at least one donor substrate, so as to form the pixels of the first zone,
performing, with a second buffer of dimensions smaller than that of the first buffer, at least one second transfer onto the support of at least a second set of pixels from the at least one donor substrate, so as to form the pixels of the second zone of the screen featuring the second density of pixels.

16. The method according to claim 15 wherein the at least one donor substrate comprises a first donor substrate comprising pixels having the first density of pixels and a second donor substrate comprising pixels having the second density of pixels, and wherein the first transfer is performed from the first donor substrate and the at least one second transfer is performed once from the second donor substrate.

17. The method according to claim 15 wherein the at least one donor substrate is a single donor substrate comprising pixels having only the first density of pixels, and wherein the first transfer is configured to form the pixels of the first zone and a part of the pixels of the second zone, and the second transfer is repeated several times to complete the pixels of the second zone so as to achieve the second density of pixels in the second zone.

18. The method according to claim 15 wherein the pixels are smart pixels, each comprising dedicated control electronics, said smart pixels each having a width smaller than or equal to 50 μm.

* * * * *